United States Patent [19]
Elliott

[11] Patent Number: 5,751,724
[45] Date of Patent: May 12, 1998

[54] DEMULTIPLEXER FOR A MULTI-BITLINE BUS

[75] Inventor: Paul M. Elliott, Jenner, Calif.

[73] Assignee: DSC Communications Corporation, Plano, Tex.

[21] Appl. No.: 606,054

[22] Filed: Feb. 23, 1996

[51] Int. Cl.[6] .................................................. H04J 3/04
[52] U.S. Cl. ........................................... 370/536; 370/366
[58] Field of Search ................................... 370/535, 536, 370/537, 538, 539, 540, 541, 542, 543, 544, 545, 546, 358, 364, 365, 366, 367, 451

[56] References Cited

U.S. PATENT DOCUMENTS

| | | | |
|---|---|---|---|
| 5,321,400 | 6/1994 | Sasaki et al. | 341/100 |
| 5,483,540 | 1/1996 | Okamura | 370/542 |
| 5,546,401 | 8/1996 | Lee et al. | 370/536 |
| 5,577,039 | 11/1996 | Won et al. | 370/466 |
| 5,588,003 | 12/1996 | Ohba et al. | 370/536 |

OTHER PUBLICATIONS

PCT Search Report, PCT/US/97/02683, Jul. 7, 1997.

*Primary Examiner*—Dang Ton
*Attorney, Agent, or Firm*—Baker & Botts, L.L.P.

[57] ABSTRACT

A demultiplexer (10) includes an input stage (12) that receives a serial data stream having a plurality of m-bit sections at a first clock rate. The input stage converts successive n-bit portions of each m-bit section into a first n-bit parallel output at a second clock rate. An intermediary stage (14) receives the first n-bit parallel output and generates a second n-bit parallel output at the second clock rate. The first n-bit parallel output corresponds to a different portion of an m-bit section than the second n-bit parallel output. An output stage (16) receives the first n-bit parallel output from the input stage (12) and the second n-bit parallel output from the intermediary stage (14). The output stage (10) places the first n-bit parallel output onto an output bus (36) having a width of m-bitlines at an earlier instance in time than the placement of the second n-bit parallel output.

16 Claims, 2 Drawing Sheets

1

DEMULTIPLEXER FOR A MULTI-BITLINE BUS

TECHNICAL FIELD OF THE INVENTION

The present invention relates in general to signal processing and more particularly to a demultiplexer for a multi-bitline bus.

BACKGROUND OF THE INVENTION

Wide parallel bus structures with many bitlines, such as sixteen and thirty-two bit wide busses, typically receive information to be transferred simultaneously on each line. This simultaneous information receipt on each line of the bus causes current spikes to occur on these lines. These current spikes cause undesirable problems to occur when transmitting high speed digital data. Previous attempts at overcoming these problems include adding additional power and ground pins to a package device implementing the wide bit bus. However, additional pin requirements increase the package size of the device, resulting in consumption of valuable space and increased costs. Therefore, it is desirable to place information onto a wide bitline bus without producing undesirable current spikes that may affect signal transmission.

SUMMARY OF THE INVENTION

From the foregoing, it may be appreciated that a need has arisen for a demultiplexer that can place information onto a wide bitline bus without producing harmful high transient current spikes. In accordance with the present invention, a demultiplexer for a multi-bitline bus is provided that substantially eliminates or reduces disadvantages and problems associated with conventional wide bitline bus applications.

According to an embodiment of the present invention, there is provided a demultiplexer for a multi-bitline bus that includes an input stage operable to receive a serial data stream partitioned into multi-bit sections having a first number of bits. The input stage generates a first parallel output having a second number of bitlines less than the first number of bits. An intermediary stage receives the first parallel output and generates a second parallel output having the second number of bitlines. The second parallel output representing a different portion of the multi-bit section than the first parallel output. An output stage receives the first parallel output from the input stage and the second parallel output from the intermediary stage. The output stage generates an output bus representing the entire multi-bit section and having the first number of bitlines. The output stage places the first parallel output onto the output bus at an earlier instance in time than when placing the second parallel output onto the output bus.

The present invention provides various technical advantages over conventional wide bitline bus techniques.

For example, one technical advantage is to reduce the transient current spikes on the output bus. Another technical advantage is to reduce the package size of the subsequent device by eliminating a number of power and ground pins compensating for the transient current spikes. Yet another technical advantage is in the reduction of noise levels on the output bus and improvements in power consumption and power supply bypassing requirements. Other technical advantages are readily apparent to one skilled in the art from the following figures, description, and claims.

BRIEF DESCRIPTION OF THE DRAWINGS

For a more compete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
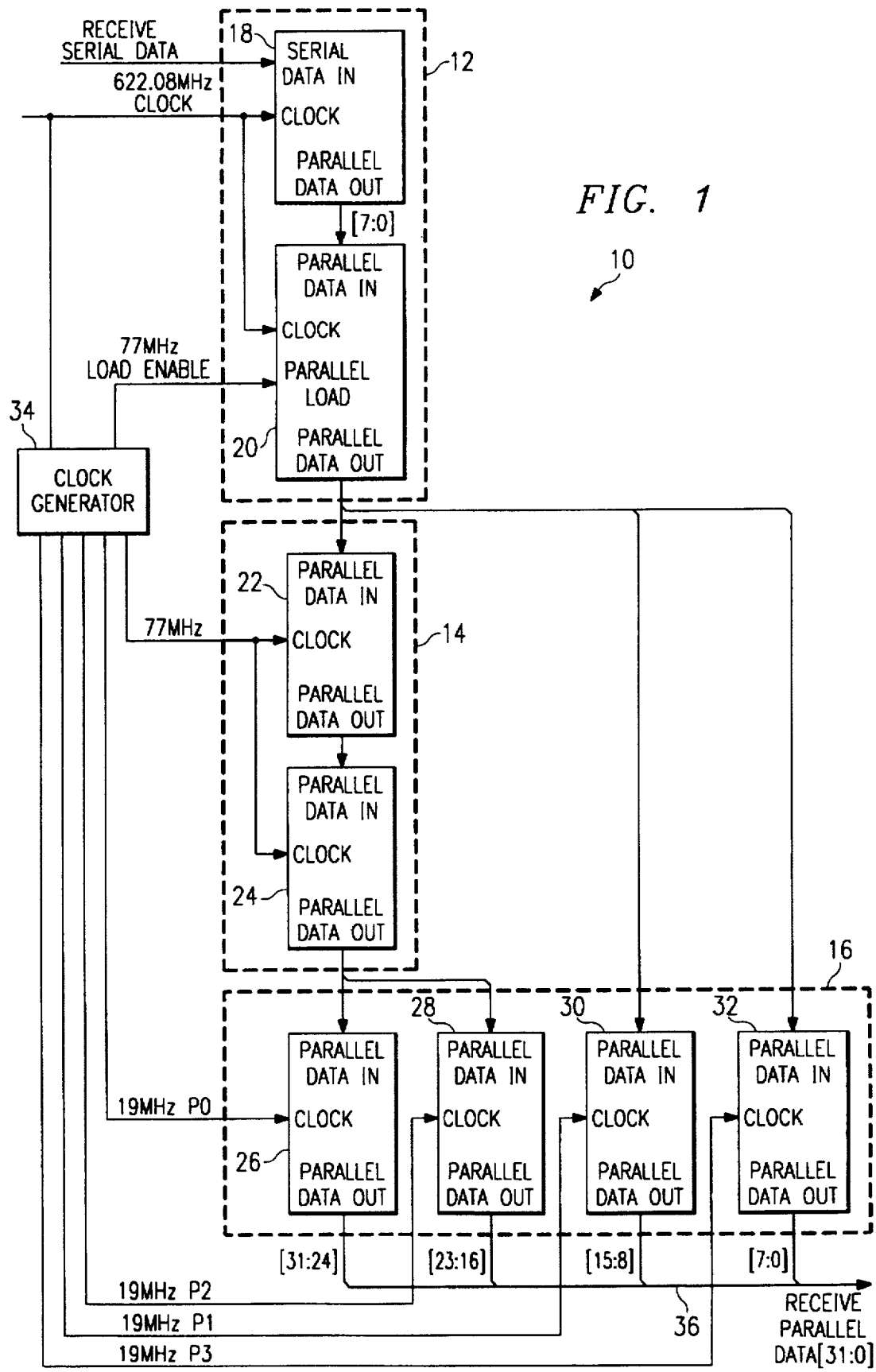
FIG. 1 illustrates a block diagram of a demultiplexer.

FIG. 1 is a block diagram of a demultiplexer 10. Demultiplexer 10 includes an input stage 12, an intermediary stage 14, and an output stage 16. Input stage 12 includes a serial to parallel shift register 18 that receives a serial data stream. The serial data stream is partitioned into a plurality of m-bit sections and clocked in at a first clock rate, in this instance 622.08 MHz. Serial to parallel shift register 18 generates successive n-bit parallel outputs from the serial data stream. Input stage 12 also includes a first holding register 20 to receive and temporarily store successive n-bit parallel outputs from serial to parallel shift register 18 at a second clock rate, in this instance 77.76 MHz. For ease of discussion, the serial data stream is described as being partitioned into 32 bit sections and the n-bit parallel outputs have 8 bitlines. Other bit and bitline sizes and clock rate frequencies may be implemented with equal effectiveness.

Intermediary stage 14 includes a second holding register 22 and a third holding register 24. Second holding register 22 receives and temporarily stores successive 8 bit parallel outputs from first holding register 20 at the 77.76 MHz rate. The third holding register 24 receives and temporarily stores successive 8 bit parallel outputs from second holding register 22 at 77.76 MHz rate. Output stage 16 includes a first output register 26 and a second output register 28 that receive and temporarily store successive 8 bit parallel outputs from third holding register 24 at a third clock rate, in this instance 19.44 MHz. Output stage 16 also includes a third output register 30 and a fourth output register 32 that receive and temporarily store successive 8 bit parallel outputs from first holding register 20 at the 19.44 MHz rate.

Demultiplexer 10 also includes a clock generator unit 34 that generates the 77.76 MHz and 19.44 MHz rates in response to the 622.08 MHz rate. Clock generator unit 34 supplies the 77.76 MHz rate to second holding register 22 and third holding register 24 as well as a load enable signal based on the 77.76 MHz rate to first holding register 20. Clock generator unit 34 supplies four phase offset clock signals P0, P2, P1, and P3 based on the 19.44 MHz rate to first output register 26, second output register 28, third output register 30, and fourth output register 32, respectively. Output stage 16 generates a 32 bit output bus 36 corresponding to the 32 bit sections of the serial data stream in response to the four phase offset clock signals.

Figure 2:
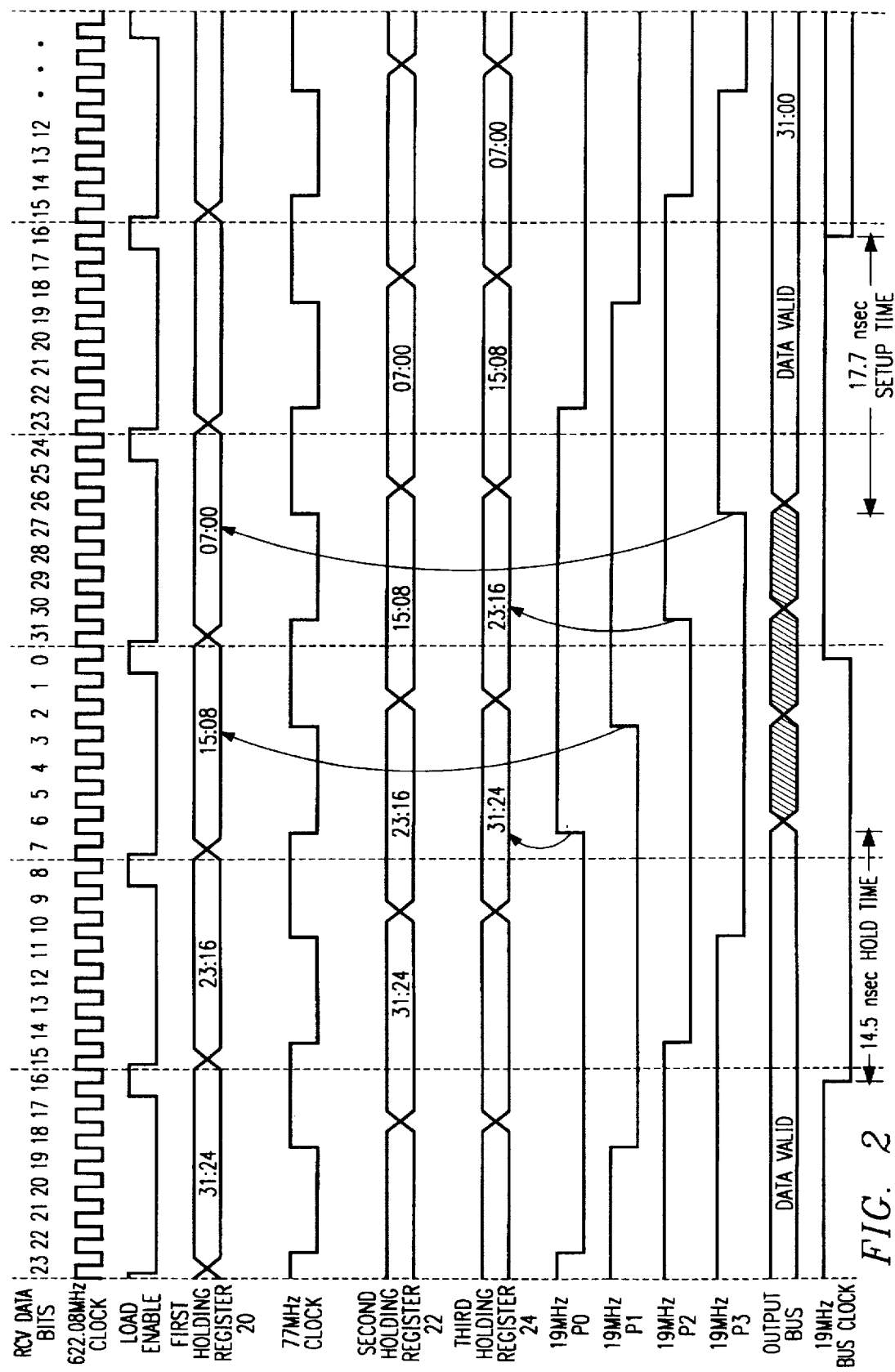
FIG. 2 illustrates a timing diagram showing operation of the demultiplexer.

FIG. 2 is a timing diagram showing the operation of demultiplexer 10. Serial to parallel shift register 18 converts successive 8 bit portions of a 32 bit section of the serial data stream from serial format to parallel format at the 622.08 rate. The load enable signal at the 77.76 MHz rate causes a first 8 bit portion from serial to parallel shift register 18 to be loaded into first holding register 20. At the next pulse of the 77.76 MHz clock, the first 8 bit portion from first holding register 20 is loaded into second holding register 22 and a second 8 bit portion from serial to parallel shift register 18 is loaded into first holding register 20. At the next pulse of the 77.76 MHz clock, the first 8 bit portion from second holding register 22 is loaded into third holding register 24, the second 8 bit portion from first holding register 20 is loaded into second holding register 22, and a third 8 bit portion from serial to parallel shift register 18 is loaded into first holding register 20.

Prior to the next pulse of the 77.76 MHz clock, clock signal P0 at the 19.44 MHz rate is asserted to cause the first 8 bit portion from third holding register 24 to be loaded into first output register 26 and placed onto output bus 36. After assertion of the P0 clock signal, clock signal P1 at the 19.44 MHz rate is asserted to cause the third 8 bit portion from first holding register 20 to be loaded into third output register 30 and placed onto output bus 36. At the next pulse of the 77.76 MHz clock, the second 8 bit portion from second holding register 22 is loaded into third holding register 24, the third 8 bit portion from first holding register 20 is loaded into second holding register 22, and a fourth 8 bit portion from serial to parallel shift register 18 is loaded into first holding register 20.

Prior to the next pulse of the 77.76 MHz clock, clock signal P2 at the 19.44 MHz rate is asserted to cause the second 8 bit portion from third holding register 24 to be loaded into second output register 28 and placed onto output bus 36. After assertion of the P2 signal, clock signal P3 is asserted to cause the fourth 8 bit portion from first holding register 20 to be loaded into fourth output register 32 and placed onto output bus 36. At the next pulse of the 77.76 MHz clock, demultiplexer 10 repeats this process for the next 32 bit section in the serial data stream.

The technique of staggering the placement of each 8 bit portion of the 32 bit section onto output bus 36 spreads out the transient noise on output bus 36 through four smaller current spikes as opposed to a large current spike that would occur from placing all 32 bits simultaneously onto output bus 36. Though staggered placement of the 8 bit portions result in a time interval where there is invalid data, an output clock of 19.44 MHz can be used to establish setup and hold times and provide falling clock edge stability for the output data. First holding register 20 improves internal timing margins and may not be needed in many implementations.

In summary, a demultiplexer processes data in a serial data stream for placement onto a multi-bitline bus. The demultiplexer places data onto the multi-bitline bus in a staggered fashion in order to reduce transient current spikes on the bus. By reducing the transient current spikes, an improvement in noise levels on the output bus can be achieved. A package size for the demultiplexer can be reduced by eliminating power and ground pins, resulting in reduced power consumption.

Thus, it is apparent that there has been provided, in accordance with the present invention, a demultiplexer for a multi-bitline bus that satisfies the advantages set forth above. Though the present invention has been described in detail, it should be understood that various changes, substitutions, and alterations can be made herein. For example, though described as having several storage registers, the demultiplexer may be implemented with other types and numbers of conventional storage elements. Other examples are readily ascertainable to one skilled in the art and may be made without departing from the spirit and scope of the present invention as defined by the following claims.

What is claimed is:

1. A demultiplexer for a multi-bitline bus, comprising:

an input stage operable to receive a serial data stream partitioned into multi-bit sections, each multi-bit section having a first number of bits, the input stage operable to generate a first parallel output having a second number of bitlines less than the first number of bits;

an intermediary stage operable to receive the first parallel output and generate a second parallel output having the second number of bitlines, the second parallel output representing a different portion of the multi-bit section than the first parallel output which was generated by the input stage and is composed of a subsequent portion of the multi-bit section;

an output stage operable to receive the first parallel output from the input stage and the second parallel output from the intermediary stage, the output stage operable to generate an output bus representing an entire multi-bit section and having a same number of bitlines as the first number of bits, the output stage operable to place the first parallel output onto the output bus at an earlier instance in time than when placing the second parallel output onto the output bus.

2. The demultiplexer of claim 1, wherein the input stage receives the serial data stream through a first clock signal, the first and second parallel outputs being generated by a second clock signal, a clock rate of the second clock signal being a fractional multiple of a clock rate of the first clock signal.

3. The demultiplexer of claim 2, wherein the first parallel output is placed onto the output bus by a third clock signal, the second parallel output being placed onto the output bus by a fourth clock signal, a clock rate of the third and fourth clock signals being a fractional multiple of the second clock signal.

4. The demultiplexer of claim 3, wherein the third and fourth clock signals have different phase offsets in order to place the first parallel output onto the output bus at an earlier time than the second parallel output.

5. The demultiplexer of claim 3, further comprising:

a clock generator unit operable to generate the second, third, and fourth clock signals in response to the first clock signal.

6. A demultiplexer for a multi-bitline bus, comprising:

a serial to parallel shift register operable to receive a serial data stream, the serial data stream being partitioned into a plurality of m-bit sections, the serial to parallel shift register operable to generate successive first, second, third, and fourth n-bit parallel outputs from the serial data stream representing successive n-bit portions of each m-bit section, wherein n is one-fourth of m;

a first holding register operable to successively receive and temporarily store the first, second, third, and fourth n-bit parallel outputs from the serial to parallel shift register;

a second holding register operable to successively receive and temporarily store the first and second n-bit parallel outputs from the first holding register;

a third holding register operable to successively receive and temporarily store the first and second n-bit parallel outputs from the second holding register;

a first output register operable to receive and temporarily store the first n-bit parallel output from the third holding register;

a second output register operable to receive and temporarily store the second n-bit parallel output from the third holding register;

a third output register operable to receive and temporarily store the third n-bit parallel output from the first holding register;

a fourth output register operable to receive and temporarily store the fourth n-bit parallel output from the first holding register;

an output bus having m-bitlines corresponding to each bit of the m-bit section, the first, second, third, and fourth output registers placing the first, second, third, and fourth n-bit parallel outputs respectively onto the output bus at staggered instances in time.

7. The demultiplexer of claim 6, wherein the serial to parallel shift register receives the serial data stream at a first clock rate, the first, second, and third holding registers receiving and temporarily storing respective successive n-bit parallel outputs at a second clock rate, the first, second, third, and fourth output registers placing respective n-bit parallel outputs onto the output bus at a third clock rate.

8. The demultiplexer of claim 7, wherein the second clock rate is one-eighth of a frequency of the first clock rate, the third clock rate being one-fourth of a frequency of the second clock rate.

9. The demultiplexer of claim 7, further comprising:

a clock generator unit operable to receive a first clock signal having the first clock rate, the serial to parallel shift register receiving the serial data stream in response to the first clock signal, the clock generator unit operable to generate the second clock rate from the first clock signal, the clock generator unit operable to generate the third clock rate from the first clock signal.

10. The demultiplexer of claim 7, wherein the first, second, third, and fourth output registers receive the third clock rate at different phase offsets.

11. The demultiplexer of claim 6, wherein the first, second, third, and fourth output registers place respective n-bit parallel outputs onto the output bus in a first n-bit parallel output, third n-bit parallel output, second n-bit parallel output, and fourth n-bit parallel output order.

12. The demultiplexer of claim 6, wherein the successive n-bit portions are 8 bits wide.

13. A method of demultiplexing serial data onto a multi-bitline bus, comprising the steps of:

receiving a serial data stream, the serial data stream carrying information in a plurality of m-bit sections;

converting successive n-bit portions of one of the plurality of m-bit sections into successive n-bit parallel sections;

placing the successive n-bit parallel sections corresponding to the one of the plurality of m-bit sections onto separate portions of an m-bitline output bus at different time intervals.

14. The method of claim 13, wherein the serial data stream is received at a first clock rate, the successive n-bit portions being converted at a second clock rate, the successive n-bit parallel sections being placed onto the m-bitline output bus through a third clock rate.

15. The method of claim 14, further comprising the step of:

offsetting a phase of the third clock rate in order to place the successive n-bit parallel sections onto the m-bitline output bus at different time intervals.

16. The method of claim 15, further comprising the steps of:

dividing the first clock rate by a first integer multiple to produce the second clock rate;

dividing the first clock rate by a second integer multiple to produce the third clock rate, the second integer multiple being greater than the first integer multiple.

* * * * *